(12) United States Patent
Sinclair (10) Patent No.: US 7,007,471 B2
(45) Date of Patent: *Mar. 7, 2006

(54) UNILATERAL THERMAL BUCKLE BEAM ACTUATOR

(75) Inventor: Michael J. Sinclair, Kirkland, WA (US)

(73) Assignee: Microsoft Corporation, Redmond, WA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/885,280

(22) Filed: Jul. 6, 2004

(65) Prior Publication Data

US 2005/0011191 A1    Jan. 20, 2005

Related U.S. Application Data

(63) Continuation of application No. 10/036,810, filed on Dec. 31, 2001, now Pat. No. 6,804,959.

(51) Int. Cl.
    *F01B 29/10*      (2006.01)
(52) U.S. Cl. ............................ 60/527; 60/528; 310/307
(58) Field of Classification Search .................. 60/527, 60/528; 310/306, 307
See application file for complete search history.

(56) References Cited

U.S. PATENT DOCUMENTS

| | | | |
|---|---|---|---|
| 3,071,036 A | 1/1963 | McKnight et al. | |
| 4,157,861 A | 6/1979 | Davies | 350/285 |
| 4,421,381 A | 12/1983 | Ueda et al. | 350/6.6 |
| 5,061,914 A | 10/1991 | Busch et al. | 337/140 |
| 5,062,689 A | 11/1991 | Koehler | 359/230 |
| 5,084,044 A | 1/1992 | Quint | 606/27 |
| 5,099,352 A | 3/1992 | Yamamoto et al. | 359/213 |
| 5,276,545 A | 1/1994 | Daun et al. | 359/198 |
| 5,392,140 A | 2/1995 | Ezra et al. | 359/41 |
| 5,445,706 A | 8/1995 | Okuno et al. | 359/198 |
| 5,469,291 A | 11/1995 | Plesko | 359/224 |
| 5,481,396 A | 1/1996 | Ji et al. | 359/295 |
| 5,504,629 A | 4/1996 | Lim | 359/850 |
| 5,543,956 A | 8/1996 | Nakagawa et al. | 359/225 |

(Continued)

FOREIGN PATENT DOCUMENTS

EP      0 774 681 A1      5/1997

(Continued)

OTHER PUBLICATIONS

Chiao, M. et al., "Self-Buckling of Micromachined Beams Under Resistive Heating", *Journal of Microelectromechanical Systems*, Mar. 2000, 9(1), 1057-7157.

(Continued)

Primary Examiner—Hoang Nguyen
(74) Attorney, Agent, or Firm—Woodcock Washburn LLP (57) ABSTRACT

A unilateral in-plane thermal buckle-beam microelectrical mechanical actuator is formed on a planar substrate of semiconductor material, for example. The actuator includes first and second anchors secured to the substrate and a floating shuttle positioned movably parallel to the substrate. Symmetric first and second sets of elongated thermal half-beams are secured between the floating shuttle and the respective first and second anchors. The first and second anchors and the first and second sets of thermal half-beams are positioned along one side of the floating shuttle. The half-beams are formed of semiconductor material, such as polysilicon. A current source directs electrical current through the thermal half beams via the anchors to impart thermal expansion of the thermal half-beams and hence linear motion of the floating center beam generally parallel to the substrate. A floating cold beam connected between the shuttle and the substrate constrains and amplifies the motion of the shuttle in a predefined direction.

31 Claims, 7 Drawing Sheets

U.S. PATENT DOCUMENTS

| | | | |
|---|---|---|---|
| 5,612,736 A | 3/1997 | Vogeley et al. | 348/207.99 |
| 5,619,177 A | 4/1997 | Johnson et al. | 337/140 |
| 5,666,226 A | 9/1997 | Ezra et al. | 359/621 |
| 5,671,083 A | 9/1997 | Conner et al. | 359/291 |
| 5,748,172 A | 5/1998 | Song et al. | 345/111 |
| 5,781,331 A | 7/1998 | Carr et al. | 359/288 |
| 5,784,189 A | 7/1998 | Bozler et al. | 359/254 |
| 5,870,007 A | 2/1999 | Carr et al. | 333/262 |
| 5,969,710 A | 10/1999 | Doherty et al. | 345/148 |
| 5,994,816 A | 11/1999 | Dhuler et al. | 310/307 |
| 6,023,121 A | 2/2000 | Dhuler et al. | 310/307 |
| 6,046,840 A | 4/2000 | Huibers | 359/291 |
| 6,108,118 A | 8/2000 | Minamoto | 359/224 |
| 6,122,089 A | 9/2000 | Minamoto et al. | 359/198 |
| 6,130,464 A | 10/2000 | Carr | 257/417 |
| 6,137,623 A | 10/2000 | Roberson et al. | 359/291 |
| 6,188,504 B1 | 2/2001 | Murakami et al. | 359/224 |
| 6,220,730 B1 | 4/2001 | Hewlett et al. | 362/297 |
| 6,229,684 B1 | 5/2001 | Cowen et al. | 361/278 |
| 6,236,491 B1 | 5/2001 | Goodwin-Johansson | 359/291 |
| 6,246,504 B1 | 6/2001 | Hagelin et al. | 359/212 |
| 6,249,370 B1 | 6/2001 | Takeuchi et al. | 359/291 |
| 6,259,548 B1 | 7/2001 | Tsugai et al. | 359/224 |
| 6,275,325 B1 | 8/2001 | Sinclair | 359/291 |
| 6,333,583 B1 * | 12/2001 | Mahadevan et al. | 310/306 |
| 6,367,251 B1 * | 4/2002 | Wood | 60/528 |
| 6,407,478 B1 * | 6/2002 | Wood et al. | 310/307 |
| 6,422,011 B1 | 7/2002 | Sinclair | 60/528 |
| 6,438,954 B1 | 8/2002 | Goetz et al. | 60/527 |
| 6,531,947 B1 | 3/2003 | Weaver et al. | 337/139 |
| 6,535,311 B1 | 3/2003 | Lindquist | 359/128 |
| 6,567,295 B1 | 5/2003 | Taussig et al. | 365/105 |
| 6,587,612 B1 | 7/2003 | Mitchell et al. | 385/18 |
| 6,672,724 B1 | 1/2004 | Peterson et al. | 353/81 |
| 6,675,578 B1 * | 1/2004 | Sinclair | 60/528 |
| 6,708,492 B1 | 3/2004 | Sinclair | 60/527 |
| 6,780,491 B1 | 8/2004 | Cathey et al. | 428/143 |
| 6,785,039 B1 | 8/2004 | Wendland, Jr. | 359/290 |
| 6,804,959 B1 | 10/2004 | Sinclair | 60/527 |
| 2003/0164814 A1 | 9/2003 | Starkweather et al. | 345/102 |
| 2004/0218292 A1 | 11/2004 | Huibers | 359/850 |

FOREIGN PATENT DOCUMENTS

| | | |
|---|---|---|
| EP | 0 831 252 A2 | 3/1998 |
| EP | 0 778 657 B1 | 9/2001 |
| EP | 1 201 602 A2 | 5/2002 |
| EP | 1 289 273 A1 | 3/2003 |
| EP | 0 692 729 B1 | 4/2003 |
| EP | 1 341 025 A1 | 9/2003 |
| EP | 1 143 467 B1 | 9/2004 |
| FR | 2 703 475 | 10/1994 |
| FR | 2 749 693 | 12/1997 |
| JP | 10-39239 | 2/1998 |
| WO | WO 98/35258 | 8/1998 |
| WO | WO 99/36825 | 7/1999 |
| WO | WO 00/67268 | 11/2000 |
| WO | WO 00/73839 A1 | 12/2000 |
| WO | WO 01/42844 A2 | 6/2001 |
| WO | WO 01/45120 A2 | 6/2001 |
| WO | WO 01/84531 A1 | 11/2001 |

OTHER PUBLICATIONS

Lee, J.Y. et al., "A Characterization of the Thermal parameters of Thermally Driven Polysilicon Microbridge Actuators Using Electrical Impedance Analysis", *Sensors and Actuators*, May 1999, 75(1)(4), 86-92, XP004147068.

Noworolski, J.Mark. et al., "Process for In-Plane and Out-of-Plane Single-Crystal-Silicon thermal Microactuators", *Sensors and Actuators*, 1996, 55, 65-69.

Sinclair, M.J., "1D and 2D Scanning Mirrors Using Thermal Buckle-Beam Actuation", *Proceedings of the SPIE*, Dec. 2001, 4592(17), 307-314, XP009019263.

Sinclair, M.J., "A High Force Low Area MEMS Thermal Actuator", *The 7th Intersociety Conference on Thermal and Thermomechanical Phenomena in Electronic Systems*, May 2000, 127-132, XP010510393.

Chang, C. et al., "Innovative Micromachined Microwave Switch with Very Low Insertion Loss", *Sensors and Actuators*, 2000, 71-75.

Chen, R.T. et al., "A Low Voltage Micromachined Optical Switch by Stress-Induced Bending", *Micro Electro Mechanical Systems*, 1999, 424-428, XP 010321766.

Hagelin, P.M. et al., "Optical Raster-Scanning Displays Based on Syrface-Micromachines Polysilicon Mirrors", *IEEE Journal of Selected Topics in Quantum Electronics*, Jan. 1999, 5(1), 67-74 XP000823390.

Miller, D.C. et al., "Micromachined, Flip-Chip Assembled, Actuable Contacts for Use in High density Interconnection in Electronics Packaging", *Sensors and Actuators*, 2001, 89, 76-87.

Seki, T. et al., "Thermal Buckling Actuator for Micro Relays", *Transducers*, 1997, 1153-1156.

Sinclair, M. "A High Frequency Resonant Scanner Using Thermal Actuation", *Technical Digest, 15th International Conference on Micro Electro Mechanical Systems*, Jan. 2002, 698-701.

* cited by examiner

UNILATERAL THERMAL BUCKLE BEAM ACTUATOR

CROSS REFERENCE TO RELATED APPLICATIONS

This application is a continuation of application Ser. No. 10/036,810; filed Dec. 31, 2001 now U.S. Pat. No. 6,804,959 which is incorporated herein by reference in its entirety.

FIELD OF THE INVENTION

The present invention relates to microelectromechanical system (MEMS) actuators and, in particular, to thermal microelectromechanical system actuators that are activated by Joule heating.

BACKGROUND OF THE INVENTION

Microelectromechanical system (MEMS) actuators provide control of very small components that are formed on semiconductor substrates by conventional semiconductor (e.g., CMOS) fabrication processes. MEMS systems and actuators are sometimes referred to as micromachined systems-on-a-chip.

One of the conventional MEMS actuators is the electrostatic actuator or comb drive. Commonly, such actuators include two comb structures that each have multiple comb fingers aligned in a plane parallel to a substrate. The fingers of the two comb structures are interdigitated with each other. Potential differences applied to the comb structures establish electrostatic interaction between them, thereby moving the comb structures toward each other.

Advantages of the electrostatic actuator are that they require low current, which results in small actuation energy, and have a relatively high frequency response. Disadvantages are that they require high drive voltages (e.g., tens or hundreds of volts) and large areas and provide low output forces. For example, this type of actuator can produce a force of 0.0059 nN/volt$^2$ per comb-finger height ($\mu$m) and can yield a typical actuator force density of about 20 $\mu$N/mm$^2$, with the area referring to the surface area of the actuator. Comb drive (electrostatic) actuators used for deployment of microstructures typically occupy many times the area of the device they are deploying. Also, the high voltages (e.g., tens or hundreds of volts) required to operate electrostatic actuators can be incompatible or present difficult integration with conventional logic and low voltage electronics.

A pseudo-bimorph thermal actuator is an alternative to the electrostatic actuator. These actuators utilize differential thermal expansion of two different-sized polysilicon arms to produce a pseudo-bimorph that deflects in an arc parallel to the substrate. Such a thermal actuator produces much higher forces (100–400 times) than comb drive actuators of equal size and can operate on very low voltages and can achieve about 450 $\mu$N per/mm$^2$ of MEMS chip area. A disadvantage is the additional electrical power that is required. Two or more actuators may be coupled to a common beam through bending yokes to produce a near-linear movement, which is usually desired in MEMS systems. However, the bending of such yokes consumes much of the force output of the actuators.

SUMMARY OF THE INVENTION

The present invention includes a unilateral in-plane thermal buckle-beam microelectrical mechanical actuator formed on a planar substrate of semiconductor material, for example. The actuator includes first and second anchors secured to the substrate along one side of an elongated floating in-plane shuttle that is movable relative to the substrate. First and second sets of elongated thermal half-beams are secured between the floating in-plane shuttle and the respective first and second anchors. An elongated cold beam is aligned transverse to the elongated floating in-plane shuttle and has one end coupled thereto and the other end coupled to the substrate through the insulating nitride layer.

The half-beams are formed of semiconductor material, such as polysilicon. A current source directs electrical current through the thermal half-beams via the anchors to cause heating and thermal expansion of the thermal half-beams. With the motion constraint imparted by the cold beam, the thermal expansion imparts near-linear motion of the floating in-plane shuttle generally parallel its length and generally parallel to the substrate. In one implementation, the half-beams are configured at a bias angle to give the floating shuttle an affinity for in-plane motion.

The resistivity of polysilicon allows the actuator b operate at voltages and currents compatible with standard integrated circuitry (e.g., CMOS). In addition, actuators according to the present invention are very small in area, have relatively high force, and can provide relatively long actuation displacements (e.g. 10–20 microns) at very small increments, making them suitable for deployment of MEMS devices as well as providing minute adjustments in MEMS systems. In one implementation, the present actuator array can produce a force of about 3700 $\mu$N per square mm and with 1.53 mW per $\mu$N of power. This electrically stimulated movement can be used in micro motors, optical scanning devices, MEMS deployment mechanisms and other areas requiring mechanical movement on a micro scale.

Additional objects and advantages of the present invention will be apparent from the detailed description of the preferred embodiment thereof, which proceeds with reference to the accompanying drawings.

DETAILED DESCRIPTION OF ILLUSTRATIVE EMBODIMENTS

To assist with understanding the present invention, the general procedure for fabricating micromechanical devices using the MUMPs process is explained with reference to FIGS. 1–15.

The MUMPs process provides three-layers of conformal polysilicon that are etched to create a desired physical structure. The first layer, designated POLY 0, is coupled to a supporting wafer, and the second and third layers, POLY 1 and POLY 2, respectively, are mechanical layers that can be separated from underlying structure by the use of sacrificial layers that separate layers and are removed during the process.

The accompanying figures show a general process for building a micro-motor as provided by the MEMS Technology Applications Center, 3021 Cornwallis Road, Research Triangle Park, N.C.

The MUMPs process begins with a 100 mm n-type silicon wafer 10. The wafer surface is heavily doped with phosphorus in a standard diffusion furnace using POCI 3 as the dopant source. This reduces charge feed-through to the silicon from electrostatic devices subsequently mounted on the wafer. Next, a 600 nm low-stress Low Pressure Chemical Vapor Deposition (LPCVD) silicon nitride layer 12 is deposited on the silicon as an electrical isolation layer The silicon wafer and silicon nitride layer form a substrate.

Figures 1, 2:
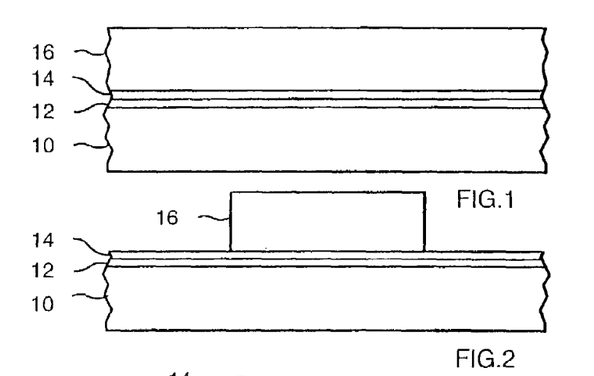
FIGS. 1–15 are cross-section views of a general multi-user MEMS process known in the prior art for fabricating microelectrical mechanical devices. Cross-hatching is omitted to improve clarity of the prior art structure and process depicted.

Next, a 500 nm LPCVD polysilicon film—POLY 0 14—is deposited onto the substrate. The POLY 0 layer 14 is then patterned by photolithography; a process that includes coating the POLY 0 layer with a photoresist 16, exposing the photoresist with a mask (not shown) and developing the exposed photoresist to create the desired etch mask for subsequent pattern transfer into the POLY 0 layer (FIG. 2). After patterning the photoresist, the POLY 0 layer 14 is etched in a Reactive Ion Etch (RIE) system (FIG. 3).

Figures 3, 4, 5:
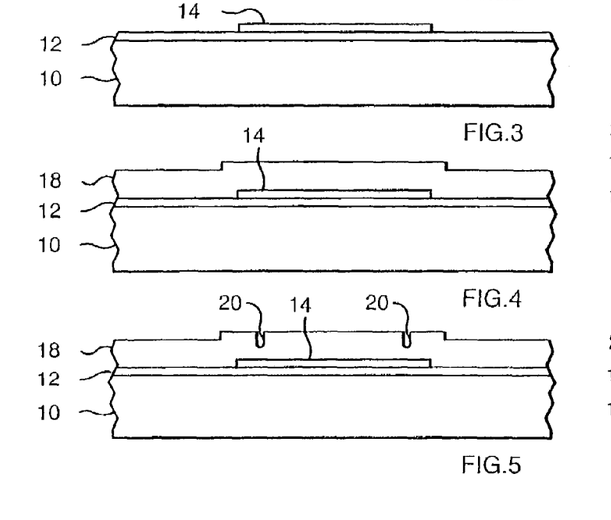
Figures 6, 7:
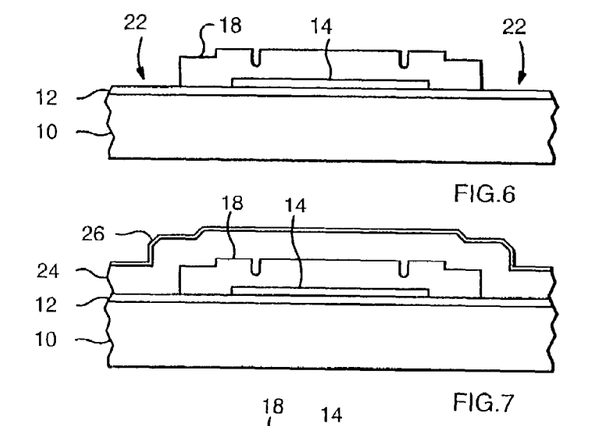

With reference to FIG. 4, a 2.0 μm phosphosilicate glass (PSG) sacrificial layer 18 is deposited by LPCVD onto the POLY 0 layer 14 and exposed portions of the nitride layer 102. This PSG layer, referred to herein as a First Oxide, is removed at the end of the process to free the first mechanical layer of polysilicon, POLY 1 (described below) from its underlying structure; namely, POLY 0 and the silicon nitride layers. This sacrificial layer is lithographically patterned with a DIMPLES mask to form dimples 20 in the First Oxide layer by RIE (FIG. 5) at a depth of 750 nm The wafer is then patterned with a third mask layer, ANCHOR1, and etched (FIG. 6) to provide anchor holes 22 that extend through the First Oxide layer to the POLY 0 layer The ANCHOR 1 holes will be filled in the next step by the POLY 1 layer 24.

Figures 8, 9:
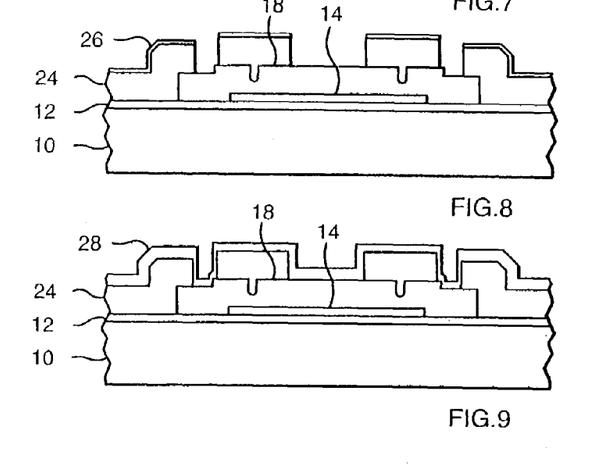

After the ANCHOR1 etch, the first structural layer of polysilicon(POLY 1) 24 is deposited at a thickness of 2.0 μm. A thin 200 nm PSG layer 26 is then deposited over the POLY1 layer 24 and the wafer is annealed (FIG. 7) to dope the POLY 1 layer with phosphorus from the PSG layers. The anneal also reduces stresses in the POLY1 layer. The POLY 1 and PSG masking layers 24, 26 are lithographically patterned to form the structure of the POLY 1 layer. After etching the POLY 1 layer (FIG. 8), the photoresist is stripped and the remaining oxide mask is removed by RIE After the POLY 1 layer 24 is etched, a second PSG layer(hereinafter "Second Oxide") 28 is deposited (FIG. 9). The Second Oxide is patterned using two different etch masks with different objectives.

Figure 10:
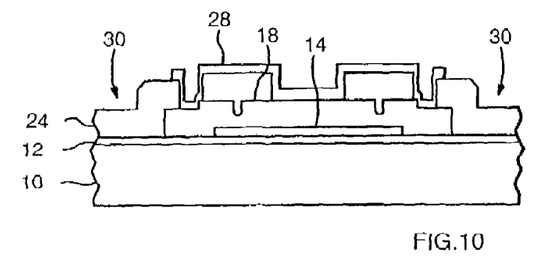

First, a POLY1_POLY2_VIA etch (depicted at 30) provides for etch holes in the Second Oxide down to the POLY 1 layer 24. This etch provide a mechanical and electrical connection between the POLY 1 layer and a subsequent POLY 2 layer. The POLY1_POLY2_VIA layer is lithographically patterned and etched by RIE (FIG. 10).

Figure 11:
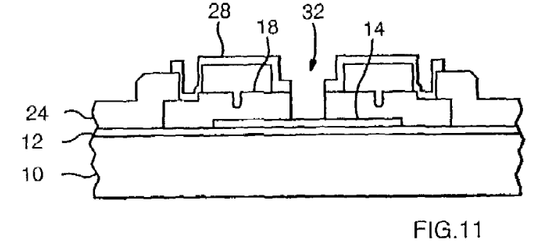
Figure 12:
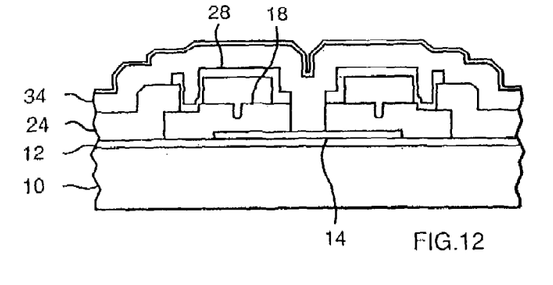

Second, an ANCHOR2 etch (depicted at 32) is provided to etch both the First and Second Oxide layers 18, 28 and POLY 1 layer 24 in one step (FIG. 11). For the ANCHOR 2 etch, the Second Oxide layer is lithographically patterned and etched by RIE in the same way as the POLY1_POLY2_VIA etch. FIG. 11 shows the wafer cross section after both POLY1_POLY2_VIA and ANCHOR2 etches have been completed.

Figure 13:
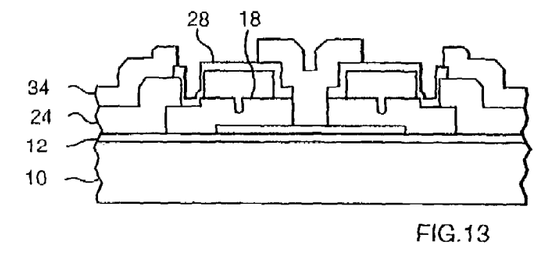

A second structural layer, POLY 2, 34 is then deposited at a thickness of 1.5 μm, followed by a deposition of 200 nm of PSG. The wafer is then annealed to dope the POLY 2 layer and reduce its residual film stresses. Next, the POLY 2 layer is lithographically patterned with a seventh mask and the PSG and POLY 2 layers are etched by RIE. The photoresist can then be stripped, and the masking oxide is removed (FIG. 13).

Figure 14:
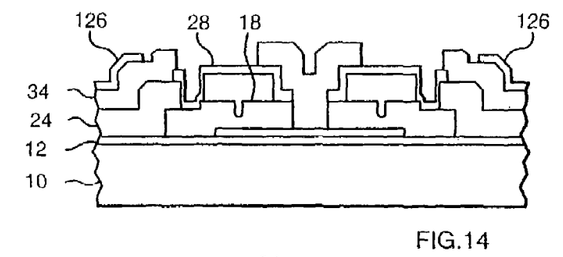

The final deposited layer in the MUMPs process is a 0.5 μm metal layer 36 that provides for probing, bonding, electrical routing and highly reflective mirror surfaces. The wafer is patterned lithographically with the eighth mask and the metal is deposited and patterned using a lift-off technique. The final, unreleased exemplary structure is shown in FIG. 14.

Figure 15:
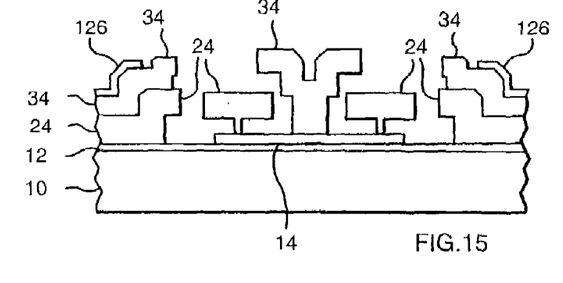

Lastly, the wafers undergo sacrificial release and test using known methods. FIG. 15 shows the device after the sacrificial oxides have been released.

Figure 16:
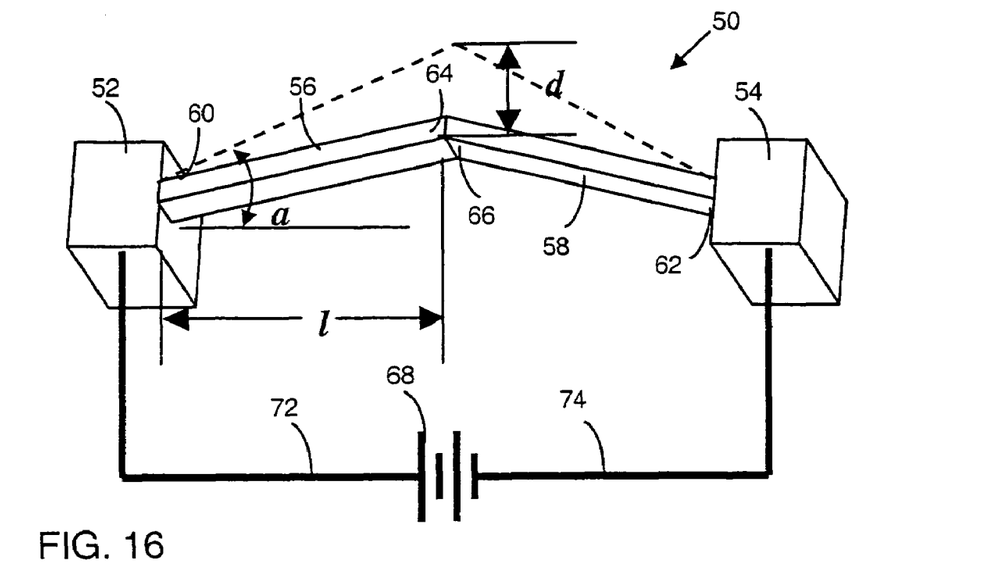
FIG. 16 is a diagrammatic isometric diagram of a bilateral microelectrical mechanical in-plane buckle-beam actuator having one pair of thermal half-beam structures.

In preferred embodiments, the device of the present invention is fabricated by the MUMPs process in accordance with the steps described above. However, the device of the present invention does not employ the specific masks shown in the general process of FIGS. 1–15, but rather employs masks specific to the structure of the present invention Also, the steps described above for the MUMPs process may change as dictated by the MEMS Technology Applications Center. The fabrication process is not a part of the present invention and is only one of several processes that can be used to make the present invention FIG. 16 is a diagrammatic isometric illustration of a bilateral microelectrical mechanical in-plane thermal buckle-beam actuator 50. Bilateral actuator 50 includes a pair of structural anchors 52 and 54 that are secured to a substrate (e.g., substrate 10 through the insulating nitride 12, not shown) and thermal half-beams 56 and 58 that are secured at their base ends 60 and 62 to anchors 52 and 54, respectively. Half-beams 56 and 58 extend substantially parallel to and spaced-apart from the substrate and meet each other at the irrespective distal ends 64 and 66.

Structural anchors 52 and 54 and half-beams 56 and 58 have electrically semi-conductive and positive coefficient of thermal expansion properties. Bilateral actuator 50 is activated when an electrical current is passed from a current source 68 through half-beams 56 and 58 via electrically conductive couplings 72 and 74 and respective structural anchors 52 and 54. The applied current induces ohmic or Joule heating of half-beams 56 and 58, thereby causing them to expand longitudinally toward each other and ultimately to buckle.

In the illustrated implementation, half-beams 56 and 58 are each formed at an in-plane bias angle relative to a line extending between respective anchors 52 and 54. The bias angles of half-beams 56 and 58 are structural features that provide an affinity for half-beams 56 and 58 to move in-plane (parallel to the substrate) when they buckle. The actuator displacement d is given by $$d=[l^2+2(l)l'+l'^2-(l\cos(a))^2]^{1/2}-l/\sin(a)$$

where

*l* is the distance between the anchors associated with a half-beam,

*l'* is the elongation of the half-beam due to thermal expansion, and a is the pre-bend angle of the beam.

The coefficient of thermal expansion used for polysilicon is $2.33 \times 10^{-6}/°C$.

Figure 17:
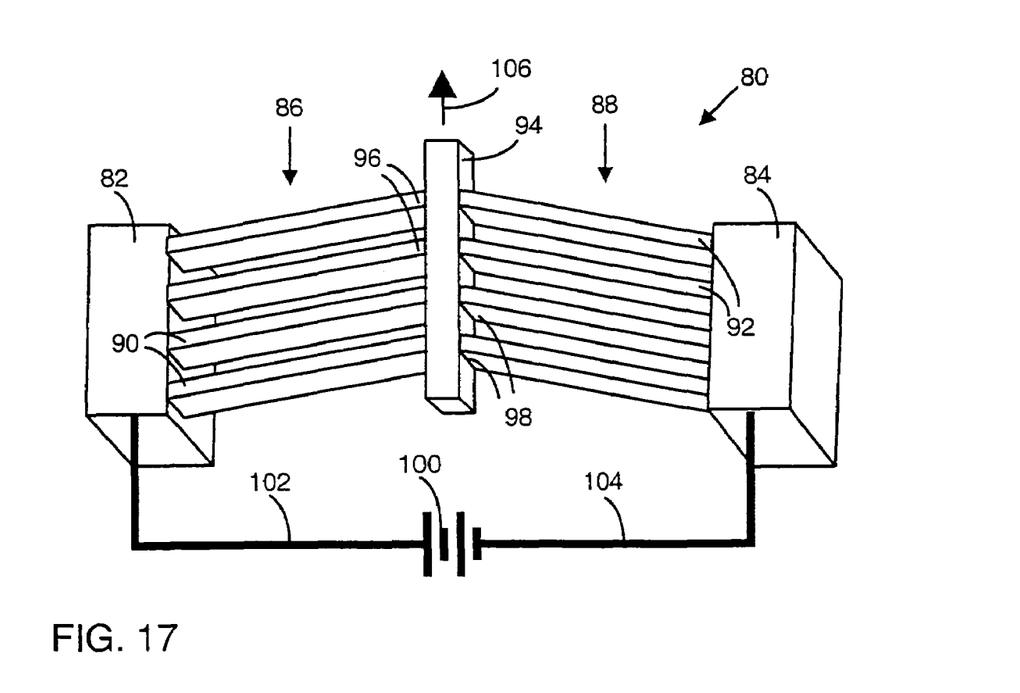
FIG. 17 is a diagrammatic isometric diagram of a bilateral microelectrical mechanical in-plane buckle-beam actuator having multiple pairs of thermal half-beam structures.

FIG. 17 is a diagrammatic isometric illustration of a bilateral microelectrical mechanical in-plane thermal buckle-beam actuator 80 having a pair of structural anchors 82 and 84 secured to a substrate (e.g., substrate 10 through the insulating nitride layer 12, not shown) Multiple thermal half-beams 86 and 88 (four of each shown) are secured at their base ends 90 and 92 to anchors 82 and 84, respectively. Half-beams 86 and 88 extend over the substrate and meet opposite sides of a floating center in-plane shuttle 94 at their respective distal ends 96 and 98.

Center beam 94 provides mechanical coupling of the multiple half-beams 86 and 88 as well as providing structure for transmitting the resulting linear force to another device, In addition, center beam 94 stiffens the middle of bilateral actuator 80 where half-beams 86 and 88 meet. Multiple half-beams 86 and 88 are formed at in-plane bias angles to provide an affinity for them to buckle and move in-plane (parallel to the substrate). The in-plane bias angles of half-beams 86 and 88 relative to anchors 82 and 84 give bilateral actuator 80 an overall chevron configuration.

In one implementation, anchors 82 and 84, half-beams 86 and 88, and center beam 94 are each made in the same semiconductor layer or layers (e.g., polysilicon). With reference to the structures of FIGS. 1–15, for example, anchors 82 and 84 are secured to insulating nitride layer 12 on substrate 10. Half-beams 86 and 88 and center beam 94 are released from substrate 10 and free to move relative thereto. Current is applied from a current source 100 through electrically conductive couplings 102 and 104 to anchors 82 and 84. The current passes through half-beams 86 and 88, which heats them and causes them to lengthen due to the positive temperature coefficient of expansion of silicon. As a result, center beam 94 moves and exerts a force outward along a linear axis 106, parallel to substrate 10. When the current ceases, half-beams 86 and 88 cool and contract, which causes center beam 94 to return to its initial position with a force equal to the actuation force, but in an opposite direction along axis 106.

In one implementation, half-beams 86 and 88 have cross-sectional dimensions of 2 $\mu$m×2 $\mu$m and lengths of between 200 $\mu$m and 220 $\mu$m. It will be appreciated, however, that these dimensions are merely exemplary. For example, half-beams 86 and 88, as well as anchors 82 and 84 and center beam 94, can be fabricated out of either or both of the releasable MUMPs polysilicon layers, but with anchors 82 and 84 not being released In such MUMPS implementations, actuator 80 can have possible thicknesses of 1.5, 2.0 or 3.5 $\mu$m.

Generally, the present invention is adaptable to any fabrication process that includes at least one releasable layer that has a positive temperature coefficient of expansion and is capable of carrying a current for ohmic heating. Moreover, there is no theoretical limit to the number of half-beams 86 and 88 so long as the actuator and its associated conductors can handle the current and heat, the beams can lose heat rapidly, and there is not significant cross coupling ofheat between half-beams. In one implementation, the heating temperature was kept below 800° C. to prevent self-annealing, which can cause irreversible damage.

Figure 18:
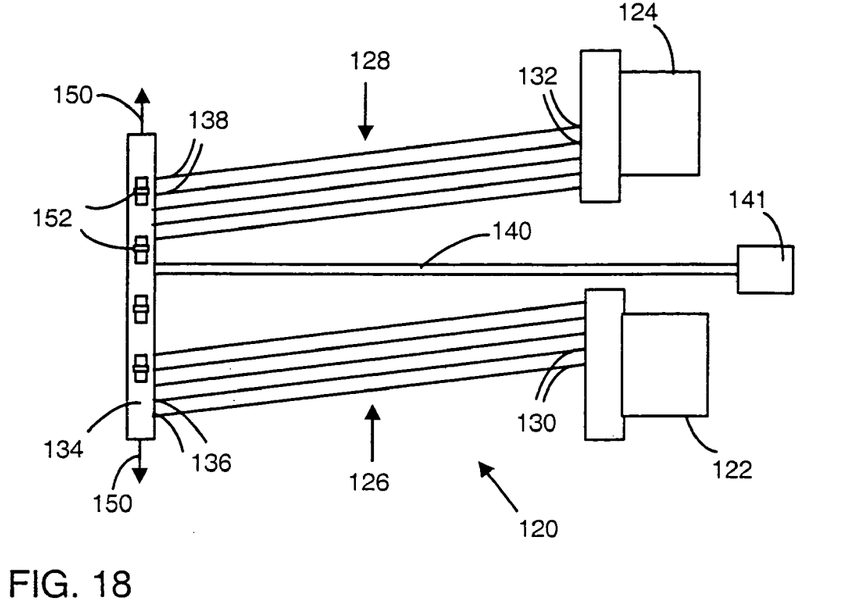
FIG. 18 is a plan view of a unilateral microelectrical mechanical in-plane buckle-beam actuator having multiple thermal half-beam structures and one elongated floating cold beam.

FIG. 18 is a diagrammatic plan view of a unilateral microelectrical mechanical in-plane thermal buckle-beam actuator 120. Unilateral actuator 120 includes a pair of structural anchors 122 and 124 mechanically secured to and electrically insulated from a substrate (e.g., substrate 10, not shown). Multiple thermal half-beams 126 and 128 are secured at their base ends 130 and 132 to anchors 122 and 124, respectively. Half-beams 126 and 128 extend over the substrate and meet a floating in-plane shuttle or slider 134 at their respective distal ends 136 and 138. Anchors 122 and 124 and half-beams 126 and 128 are positioned are positioned together along one side of in-plane shuttle 134, thereby making unilateral actual 120 more compact than bilateral actuator 80.

Anchors 122 and 124 may be the same as or analogous to anchors 82 and 84, and half-beams 126 and 128 are analogous to half-beams 86 and 88. For example, half-beams 126 and 128 may be configured at a bias angle to give floating shuttle 134 an affinity for in-plane motion. In one implementation, the bias angle is about 1.05 degrees With regard to this implementation, the bias angle shown in FIG. 18 is exaggerated for purposes of illustration Half-beams 126 and 128 are generally all the same in one implementation, but in other implementations there may be variations among the half-beams.

Unilateral actuator 120 further includes a cold beam 140 that is transverse (e.g., generally perpendicular) and coupled at one end to in-plane shuttle 134. Cold beam 140 is secured at its other end to a cold beam anchor 141 that is mechanically secured to the substrate (e.g., substrate 10, not shown). Cold beam 140 mechanically and electrically floats and receives generally no electrical current during thermal heating of half-beams 126 and 128, so that cold beam 140 is not heated (i.e., remains "cold") and does not undergo the thermal expansion of half-beams 126 and 128. Cold beam 140 therefore prevents shuttle 134 from being pushed transverse to its length and constrains it to move in-plane along its length with the thermal expansion of half-beams 126 and 128.

Cold beam 140 does not contribute any force to moving actuator 120, but rather requires a force to be bent As a consequence, cold beam 140 reduces the efficiency of actuator 120 relative to that of a corresponding bilateral actuator, in which every beam contributes to the force or motion of the actuator. Also, any elongation of cold beam 140 will reduce the efficiency of actuator 120.

Figure 19:
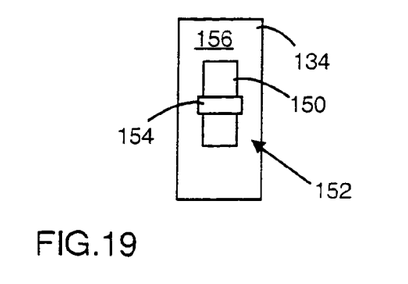
FIG. 19 is a plan view of an optional alignment structure for guiding motion of an in-plane shuttle.
Figure 20:
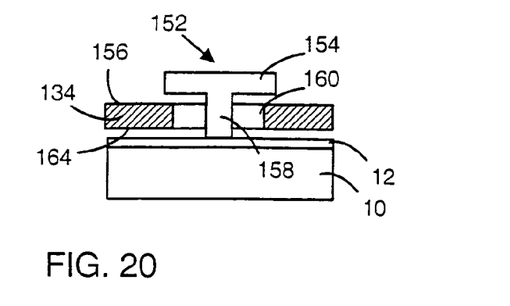
FIG. 20 is a partial sectional end view of an alignment structure for guiding motion of an in-plane shuttle.

The free, floating motion of center beam 134 is optionally further guided along a line or axis of motion 150 by two or more alignment structures (e.g., four shown) 152 Alignment structures 152 are optional and are shown in greater detail in FIGS. 19 and 20.

FIG. 19 is a top plan view showing alignment structure 152 with aguide 154 that extends at least partly across a top surface 156 of shuttle 134. FIG. 20 is a partial section end view of the same. Guide 154 includes a base 158 that extends from the substrate (e.g.,substrate 10) through a slotted aperture 160 in shuttle 134. Guide 154 may be formed, for example, as a second polysilicon layer, POLY2, in a conventional MUMPS process. Alignment structures 152 function to guide shuttle 134 along its axis of motion 150 and to prevent out-of-plane excursions by shuttle 134.

Figure 21:
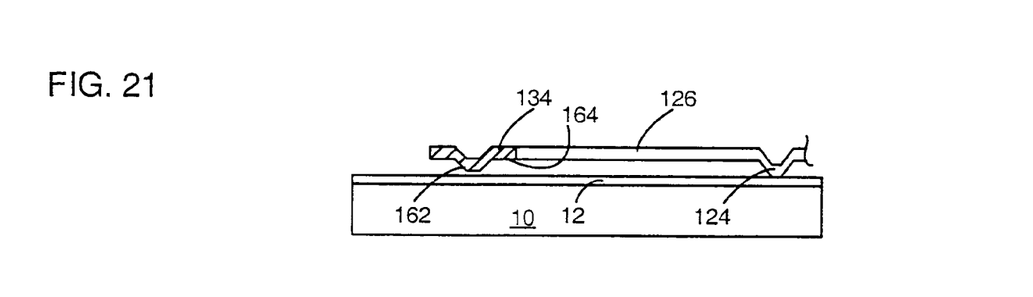
FIG. 21 is a sectional end view of a dimple bearing extending from a bottom surface of an actuator center beam.
Figure 22:
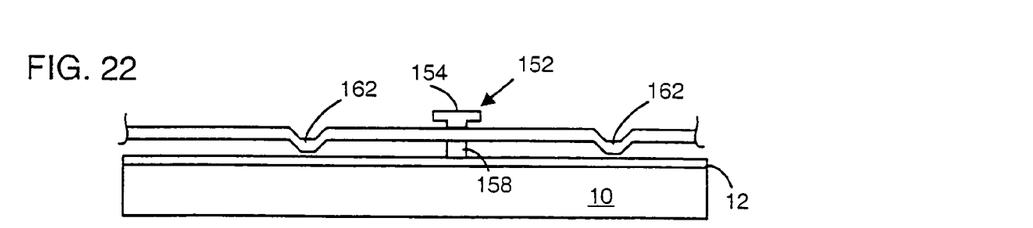
FIG. 22 is a side view showing a pair of dimple bearings positioned on opposite sides of an alignment structure.

FIG. 21 is a sectional end view of a dimple bearing 162 extending from a bottom surface 164 of shuttle 134, for example, to prevent stiction by a reduction of contacting surface area where shuttle 134 is in contact with substrate 10 (e.g., the nitride layer 12). In one implementation, shuttle 134 would include multiple spaced-apart dimple bearings 162. For example, dimple bearings 162 (only one shown) that extend from bottom surface 164 by 0.5 $\mu$m help reduce the surface area of released polysilicon structures that would normally have contact with substrate 10 (e.g., the nitride layer 12). FIG. 22 is aside view showing a pair of dimple bearings 162 positioned on opposite sides of an alignment structure 152.

Figure 23:
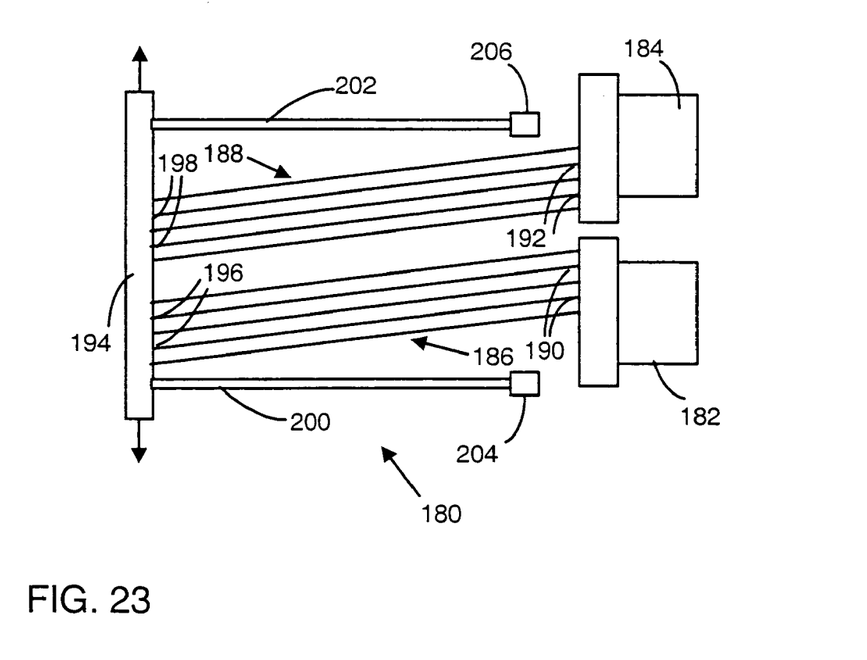
FIG. 23 is a plan view of a unilateral microelectrical mechanical in-plane thermal buckle-beam actuator with a pair of elongated floating cold beams.

FIG. 23 is a diagrammatic plan view of a unilateral microelectrical mechanical in-plane thermal buckle-beam actuator 180. Unilateral actuator 180 includes a pair of structural anchors 182 and 184 mechanically secured to and electrically insulated from a substrate (e.g., substrate 10, not shown). Multiple thermal half-beams 186 and 188 are secured at their base ends 190 and 192 to anchors 182 and 184, respectively. Half-beams 186 and 188 extend over the substrate and meet a floating in-plane shuttle 194 at their respective distal ends 196 and 198. Anchors 182 and 184 and thermal half-beams 186 and 188 are positioned together along one side of in-plane shuttle 194. Unilateral actuator 180 is substantially the same as unilateral actuator 120, except that the former includes a pair of cold beams 200 and 202 rather than just one cold beam 140.

Cold beams 200 and 202 are each transverse (e.g., generally perpendicular) and coupled at one end to in-plane shuttle 194. The opposite ends of cold beams 200 and 202 are coupled to respective cold beam anchors 204 and 206 that are mechanically secured to the substrate (e.g., substrate 10, not shown). Cold beams 200 and 202 are parallel to each other and, together with in-plane shuttle 194 and the substrate between anchors 204 and 206, form a quasi-four-beam linkage. As a result, cold beams 200 and 202 better constrain in-plane shuttle 194 to linear motion along its longitudinal axis.

Figure 24:
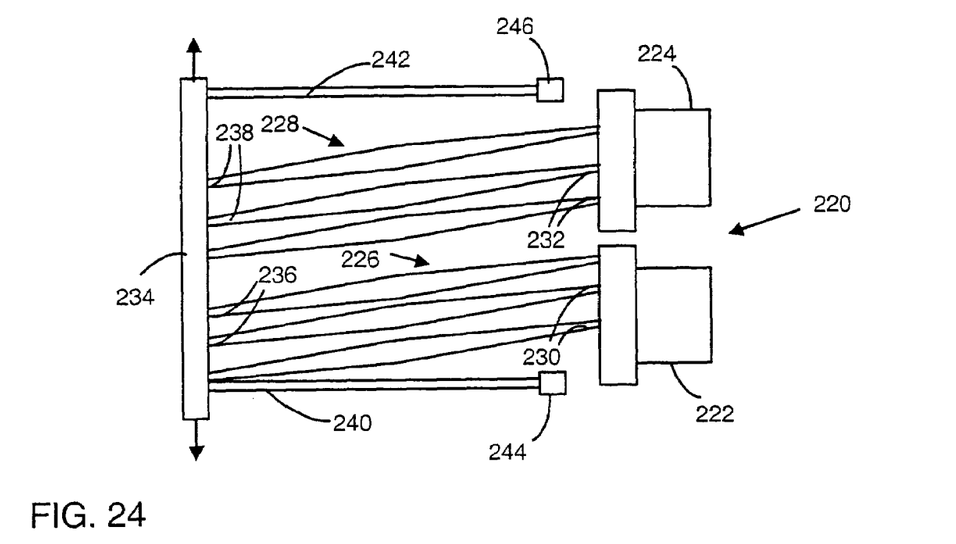
FIG. 24 is a plan view of a unilateral microelectrical mechanical in-plane thermal buckle-beam actuator with multiple thermal half-beam structures that are tapered from about their centers.

FIG. 24 is a diagrammatic plan view of a unilateral microelectrical mechanical in-plane thermal buckle-beam actuator 220 generally with the same configuration as unilateral actuator 180. Alternatively, actuator 220 could have generally the same configuration as unilateral actuator 120.

Unilateral actuator 220 includes a pair of structural anchors 222 and 224 mechanically secured to and electrically insulated from a substrate (e.g., substrate 10, not shown). Multiple thermal half-beams 226 and 228 are secured at their base ends 230 and 232 to anchors 222 and 224, respectively. Half-beams 226 and 228 extend over the substrate and meet a floating in-plane shuttle 234 at their respective distal ends 236 and 238. A pair of cold beams 240 and 242 are each transverse (e.g., generally perpendicular) to and coupled at one end to in-plane shuttle 234. The opposite ends of cold beams 240 and 242 are coupled to respective cold beam anchors 244 and 246 that are mechanically secured to the substrate (e.g., substrate 10 through the nitride 12, not shown).

Thermal half-beams 226 and 228 differ from thermal half-beams 186 and 188 in that the former have more mass near their centers than at their ends. In particular, thermal half-beams 226 and 228 are wider (in-plane) near their centers and taper towards their ends. In one implementation, thermal half-beams 226 and 228 have a width near their centers (e.g., 6 microns) that is about twice the width near their ends (e.g., 3 microns) In contrast, thermal half-beams 186 and 188 are shown as having generally parallel sides and being of a uniform width.

The tapered configuration of thermal half-beams 226 and 228 decreases the tendency to flex out-of-plane and increases their current carrying capacity. With uniform-sized (i.e., un-tapered) half-beams, the anchors (e.g., 182 and 184) and shuttle (e.g., 194) function as thermal heat sinks that keep the ends of the beams at a lower temperature than the centers when current is passed through the half-beams to impart thermal expansion. As the current is increased, the centers of uniform-sized half-beams get hotter, sometimes until material deformation or decomposition causes failure of the actuator.

The tapered configuration of thermal half-beams 226 and 228 minimizes temperature difference characteristics of uniform-sized half-beams, thereby improving temperature uniformity along half-beams 226 and 228 and allowing thermal expansion effects to be maximized It will be appreciated that the increased in-plane width of thermal half-beams 226 and 228 at their centers functions to both reduce electrical resistance (and hence the $I^2R$ heat losses) and to increase the thermal mass in the center. Keeping thermal half-beams 226 and 228 thin or narrow at their ends minimizes the force required to bend thermal half-beams 226 and 228 when they expand to displace or move shuttle 234.

Figure 25:
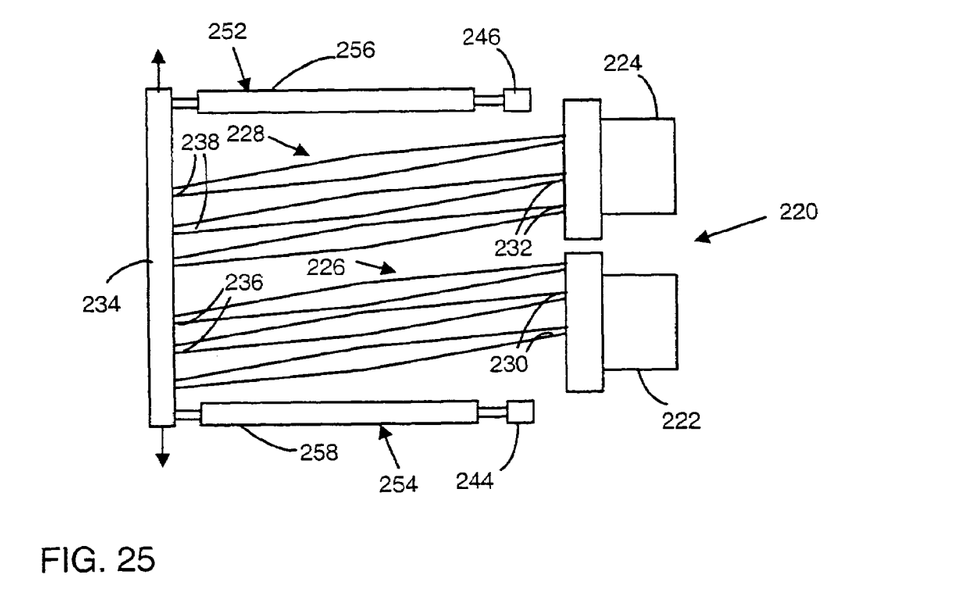
FIG. 25 is a diagrammatic plan view of a unilateral microelectrical mechanical in-plane thermal buckle-beam actuator having cold beams with widened central regions.

FIG. 25 is a diagrammatic plan view of a unilateral microelectrical mechanical in-plane thermal buckle-beam actuator 250 generally with the same configuration as unilateral actuator 220, so that common elements in actuators 220 and 250 are indicated by the same reference numerals.

Actuator 250 includes a pair of cold beams 252 and 254 that are each transverse (e.g., generally perpendicular) to and coupled at one end to in-plane shuttle 234. The opposite ends of cold beams 252 and 254 are coupled to respective cold beam anchors 244 and 246 that are mechanically secured to the substrate (e.g., substrate 10 through the nitride 12, not shown).

Cold beams 252 and 254 of actuator 250 differ from cold beams 240 and 242 of actuator 220 on that the former have widened central regions 256 and 258 that make cold beams 252 and 254 made more resistant to elongation. With this resistance to elongation and the relatively efficient flexing provided at their narrowed ends, cold beams 252 and 254 allow actuator 250 to operate more efficiently than actuator 220. It will be appreciated that the widened central regions of cold beams 252 and 254 could similarly be applied to cold beam 140 of actuator 120.

Figure 26:
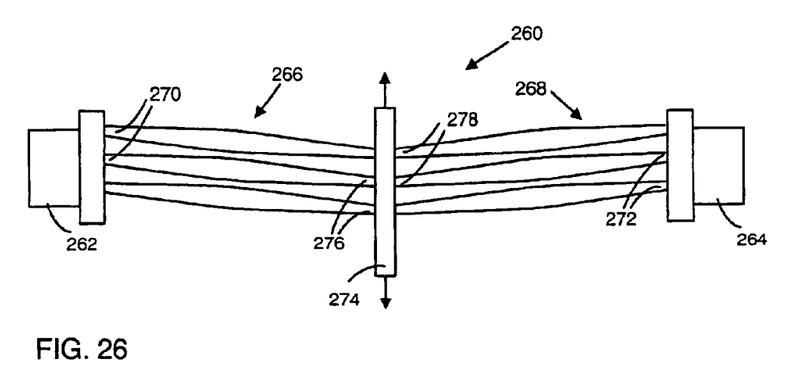
FIG. 26 is a plan view of a bilateral microelectrical mechanical in-plane thermal buckle-beam actuator with multiple thermal half-beam structures that are tapered from about their centers.

FIG. 26 is a diagrammatic plan view of a bilateral microelectrical mechanical in-plane thermal buckle-beam actuator 260 generally analogous to bilateral actuator 80. Unilateral actuator 260 includes a pair of structural anchors 262 and 264 mechanically secured to and electrically insulated from a substrate (e.g., substrate 10, not shown. Multiple thermal half-beams 266 and 268 are secured at their base ends 270 and 272 to anchors 262 and 264, respectively. Half-beams 266 and 268 extend over the substrate and meet a floating in-plane shuttle 274 at their respective distal ends 276 and 278. Anchors 262 and 264 and respective half-beams 266 and 268 are positioned along opposite sides of in-plane shuttle 274.

Thermal half-beams 266 and 268 differ from thermal half-beams 86 and 88 of actuator 80 in that the former have more mass near their centers than at their ends. In particular, thermal half-beams 266 and 268 are wider near their centers and taper towards their ends. In contrast, thermal half-beams 86 and 88 are shown as having generally parallel sides and being of a uniform width. Thermal half-beams 266 and 268 have the same improved operation and characteristics of thermal half-beams 226 and 228 described above.

Actuators according to the present invention provide near linear high efficiency output motions, in contrast to conventional thermal actuators that must have many non-force-producing mechanical linkages to convert the rotational motion to linear in many cases. The resistivity of polysilicon allows the actuator to operate at voltages and currents compatible with standard integrated circuitry (e.g., CMOS). In addition, actuators according to the present invention are very small in area, have relatively high force, and can provide relatively long actuation displacements (e.g. 10–20 microns) at very small increments, making them suitable for deployment of micro-optical devices as well as providing minute adjustments. In one implementation, the present actuator array can produce a force of about 3700 $\mu$N per square mm and with 1.53 mW per $\mu$N of force. This electrically stimulated movement can be used in micromotors, optical scanning devices, MEMS deployment mechanisms and other areas requiring mechanical movement on a micro scale.

Parts of the description of the preferred embodiment refer to steps of the MUMPs fabrication process described above. However, as stated, MUMPs is a general fabrication process that accommodates a wide range of MEMS device designs. Consequently, a fabrication process that is specifically designed for the present invention will likely include different steps, additional steps, different dimensions and thickness, and different materials. Such specific fabrication processes are within the ken of persons skilled in the art of photolithographic processes and are not a part of the present invention.

In view of the many possible embodiments to which the principles of our invention may be applied, it should be recognized that the detailed embodiments are illustrative only and should not be taken as limiting the scope of the invention. All such embodiments may come within the scope and spirit of the following claims and equivalents thereto.

What is claimed is:

1. A thermal microelectrical mechanical actuator, comprising:
   a planar substrate with first and second anchors secured thereto;
   an in-plane shuttle floating on the substrate for motion parallel to the planar substrate;
   a first plurality of elongated, substantially straight thermal half-beams that each have a base end secured to the first anchor and a distal end secured to the in-plane shuttle; and
   a second plurality of elongated, substantially straight thermal half-beams that each have a base end secured to the second anchor and a distal end secured to the in-plane shuttle, wherein each half-beam of the first and second plurality of half-beams is formed at an in-plane angle relative to a line extending between the first and the second anchors, and wherein, when heated, each half-beam of the first plurality of half-beams expands toward a respective half-beam of the second plurality of half-beams, and each half-beam of the second plurality of half beams expands toward a respective half-beam of the first plurality of half beams.

2. The actuator of claim 1 in which the in-plane shuttle has a length and two sides along its length and the first and second anchors are positioned to one side of the in-plane shuttle.

3. The actuator of claim 1 in which the thermal half-beams have more mass near their centers than at their ends.

4. The actuator of claim 1 further comprising an elongate floating cold beam that is transverse to the length of the in-plane shuttle, the floating cold beam being coupled at one end to the in-plane shuttle and at another end to the substrate.

5. The actuator of claim 1 in which each thermal half-beam is secured between its anchor and the in-plane shuttle at a non-orthogonal bias angle.

6. The actuator of claim 1 in which the in-plane shuttle is generally in-plane with the thermal half beams.

7. The actuator of claim 1 further including an alignment structure that is secured to the substrate and slidably engages the in-plane shuttle to constrain it to move generally parallel to the substrate.

8. The actuator of claim 1 in which the in-plane shuttle further includes one or more dimple bearings that project from the in-plane shuttle toward the substrate.

9. The actuator of claim 1 in which the thermal half-beams are formed of a material with a positive thermal coefficient of expansion.

10. The actuator of claim 1 in which the thermal half-beams are tapered from their centers toward their ends.

11. The actuator of claim 1 in which the thermal half-beams have in-plane widths that are tapered from the centers of the thermal half-beams toward their ends.

12. The actuator of claim 1 in which the in-plane shuttle has a length and two sides along its length and the first and second anchors are positioned on opposite sides of the in-plane shuttle and the thermal half-beams have more mass near their centers than at their ends.

13. The actuator of claim 1 in which the thermal half-beams are wider near their centers than at their ends.

14. The actuator of claim 1 further comprising electrical couplings to direct electrical current through the thermal half beams via the anchors to impart thermal expansion of the thermal half-beams and motion of their distal ends.

15. A thermal microelectrical mechanical actuator, comprising:
   a planar substrate with a pair of anchors secured thereto;
   plural elongated thermal half-beams that each have a base end secured to one of the anchors and a distal end secured to an in-plane shuttle having a length, the thermal half-beams being generally parallel to each other, wherein each half-beam is formed at an in-plane angle relative to a line extending between each anchor of the pair of anchors, and wherein, when heated, each half-beam expands toward the in-plane shuttle; and
   an elongate floating cold beam that is transverse to the length of the in-plane shuttle, the floating cold beam being coupled at one end to the in-plane shuttle and at another end to the substrate.

16. The actuator of claim 15 in which the in-plane shuttle has a length and two sides along its length and the first and second anchors are positioned to one side of the in-plane shuttle.

17. The actuator of claim 15 in which each thermal half-beam is secured between its anchor and the in-plane shuttle at a non-orthogonal bias angle.

18. The actuator of claim 15 in which the in-plane shuttle is generally in-plane with the thermal half beams.

19. The actuator of claim 15 further including an alignment structure that is secured to the substrate and slidably engages the in-plane shuttle to constrain it to move generally parallel to the substrate.

20. The actuator of claim 15 in which the in-plane shuttle further includes one or more dimple bearings that project from the in-plane shuttle toward the substrate.

21. The actuator of claim 15 in which the thermal half-beams are formed of a material with a positive thermal coefficient of expansion.

22. A thermal microelectrical mechanical actuator, comprising:
   a planar substrate with first and second anchors secured thereto;
   an in-plane shuttle floating on the substrate for motion parallel to the planar substrate, wherein the in-plane shuttle comprises one or more dimple bearings that project from the in-plane shuttle toward the substrate;
   a first plurality of elongated thermal half-beams that each have a base end secured to the first anchor and a distal end secured to the in-plane shuttle; and
   a second plurality of elongated thermal half-beams that each have a base end secured to the second anchor and a distal end secured to the in-plane shuttle, wherein each half-beam of the first and second plurality of half-beams is formed at an in-plane angle relative to a line extending between the first and the second anchors, and wherein, when heated, each half-beam of the first plurality of half-beams expands toward a respective half-beam of the second plurality of half-beams, and each half-beam of the second plurality of half beams expands toward a respective half-beam of the first plurality of half beams.

23. The actuator of claim 22 in which the in-plane shuttle has a length and two sides along its length and the first and second anchors are positioned to one side of the in-plane shuttle.

24. The actuator of claim 22 further comprising an elongate floating cold beam that is transverse to the length of the in-plane shuttle, the floating cold beam being coupled at one end to the in-plane shuttle and at another end to the substrate.

25. The actuator of claim 24 in which the floating cold beam is wider along a central region than at the cold beam ends.

26. The actuator of claim 22 in which each thermal half-beam is secured between its anchor and the in-plane shuttle at a non-orthogonal bias angle.

27. The actuator of claim 22 in which the in-plane shuttle is generally in-plane with the thermal half beams.

28. The actuator of claim 22 further including an alignment structure that is secured to the substrate and slidably engages the in-plane shuttle to constrain it to move generally parallel to the substrate.

29. The actuator of claim 22 in which the thermal half-beams are formed of a material with a positive thermal coefficient of expansion.

30. The actuator of claim 22 in which the in-plane shuttle has a length and two sides along its length and the first and second anchors are positioned on opposite sides of the in-plane shuttle.

31. The actuator of claim 22 further comprising electrical couplings to direct electrical current through the thermal half beams via the anchors to impart thermal expansion of the thermal half-beams and motion of their distal ends.

* * * * *